(12) United States Patent
Bucher

(10) Patent No.: US 11,439,042 B2
(45) Date of Patent: Sep. 6, 2022

(54) HEAT EXCHANGE ASSEMBLY FOR A COMMUNICATION SYSTEM

(71) Applicant: TE CONNECTIVITY CORPORATION, Berwyn, PA (US)

(72) Inventor: Alan Weir Bucher, Manheim, PA (US)

(73) Assignee: TE CONNECTIVITY SOLUTIONS GmbH, Schaffahusen (CH)

( * ) Notice: Subject to any disclaimer, the term of this patent is extended or adjusted under 35 U.S.C. 154(b) by 22 days.

(21) Appl. No.: 16/990,026

(22) Filed: Aug. 11, 2020

(65) Prior Publication Data

US 2021/0084791 A1   Mar. 18, 2021

Related U.S. Application Data

(60) Provisional application No. 62/899,267, filed on Sep. 12, 2019.

(51) Int. Cl.
| | |
|---|---|
| H05K 7/20 | (2006.01) |
| B23P 15/26 | (2006.01) |
| H01L 23/367 | (2006.01) |
| G02B 6/42 | (2006.01) |
| H05K 1/02 | (2006.01) |

(52) U.S. Cl.
CPC ............ H05K 7/205 (2013.01); B23P 15/26 (2013.01); H05K 7/2039 (2013.01); *G02B 6/4269* (2013.01); *H01L 23/3672* (2013.01); *H05K 1/0203* (2013.01); *H05K 7/2049* (2013.01)

(58) Field of Classification Search
CPC .... H05K 7/205; H05K 7/2039; H05K 1/0203; H05K 7/2049; G02B 6/4269; H01L 23/3672
See application file for complete search history.

(56) References Cited

U.S. PATENT DOCUMENTS

| | | | | |
|---|---|---|---|---|
| 4,498,530 | A * | 2/1985 | Lipschutz | H01L 23/4338 361/717 |
| 7,336,492 | B2 * | 2/2008 | Yu | H01L 23/4093 361/709 |
| 9,343,851 | B2 | 7/2016 | Bucher et al. | |
| 9,620,890 | B1 * | 4/2017 | Vino, IV | G02B 6/4293 |
| 9,668,379 | B1 | 5/2017 | Bucher | |
| 9,668,380 | B2 * | 5/2017 | Bucher | H05K 7/20445 |

(Continued)

OTHER PUBLICATIONS

U.S. Appl. No. 16/927,446, filed Jul. 13, 2020 (38 pages).

Primary Examiner — Lionel Nouketcha

(57) ABSTRACT

A heat exchange assembly includes a thermal bridge including upper and lower bridge elements including upper and lower plates arranged in plate stacks. The lower plates include lower fin plates and lower spacer plates with lower ends configured to be mechanically and thermally coupled to the electrical component. The upper plates include upper fin plates and upper spacer plates with upper ends configured to be mechanically and thermally coupled to a heat exchanger. The upper and lower fin plates are interleaved. The heat exchange assembly includes installation spring elements coupled between the upper and lower plates and biased against the upper and lower plates during installation. The installation spring elements are removable after the upper and lower plates are coupled to the electrical component and the heat exchanger to remove the biasing force between the upper and lower plates.

20 Claims, 4 Drawing Sheets

(56) References Cited

U.S. PATENT DOCUMENTS

| | | |
|---|---|---|
| 9,841,772 B2 | 12/2017 | Bucher |
| 9,912,107 B2 | 3/2018 | Bucher |
| 10,993,352 B2 | 4/2021 | Bucher |
| 2008/0163631 A1* | 7/2008 | Campbell ................. G06F 1/20 62/175 |
| 2009/0279263 A1* | 11/2009 | Kuo .................... H01L 23/4093 361/709 |
| 2020/0373706 A1 | 11/2020 | Bucher et al. |
| 2021/0084791 A1 | 3/2021 | Bucher |

* cited by examiner

HEAT EXCHANGE ASSEMBLY FOR A COMMUNICATION SYSTEM

CROSS REFERENCE TO RELATED APPLICATIONS

This application claims benefit to U.S. Provisional Application No. 62/899,267, filed 12 Sep. 2019, titled "HEAT EXCHANGE ASSEMBLY FOR A COMMUNICATION SYSTEM", the subject matter of which is herein incorporated by reference in its entirety.

BACKGROUND OF THE INVENTION

The subject matter herein relates generally to heat exchange assemblies for communication systems.

It may be desirable to transfer thermal energy (or heat) away from designated electrical components of a system or device. For example, packages such as processors, chips, and the like, may be mounted to a host circuit board, which generate heat when transmitting data. Typically, a heat exchanger, such as a heat sink or a cold plate is used to dissipate heat from the electrical component. A common challenge that confronts developers of such systems is thermally coupling the heat exchanger to the electrical component and maintaining a positive thermal interface between the heat exchanger and the surface of the electrical component. For example, uneven (for example, non-planar) surfaces may be presented at the thermal interface due to manufacturing tolerances and thermal expansion/contraction of the heat exchanger and the electrical component. Additionally, the heat exchanger is typically large and bulky compared to the electrical component and positioning of the heat exchanger at the surface of the electrical component may be impractical or impossible due to positioning of other components on the host circuit board around the electrical component.

Some known communication systems utilize a thermal bridge between the heat exchanger and the electrical component. Positioning of the thermal bridge between the heat exchanger and the electrical component may be difficult. Additionally, the thermal bridge may suffer from similar problems of maintaining a positive thermal interface between the thermal bridge and the electrical component and/or the heat exchanger. To overcome such problems, some known thermal bridges utilize a biasing element to maintain positive pressure at the interfaces of the thermal bridge with the heat exchanger and the electrical component. However, the biasing elements constantly impart the biasing forces, which may lead to damage or breakage, such as of the electrical component. Additionally, the biasing forces cause friction or traction between the interfaces, such as between the thermal bridge and the electrical component, which may cause warpage and damage to the electrical component.

Accordingly, there is a need for a reliable heat exchange assembly for a communication system.

BRIEF DESCRIPTION OF THE INVENTION

In one embodiment, a heat exchange assembly for a communication system having an electrical component is provided. The heat exchange assembly includes a thermal bridge including an upper bridge element and a lower bridge element separate and discrete from the upper bridge element. The upper bridge element is thermally coupled to the lower bridge element. The lower bridge element includes lower plates arranged in a lower plate stack. The lower plates include lower fin plates and lower spacer plates between the lower fin plates. The lower plates include lower ends that are configured to be mechanically and thermally coupled to the electrical component to dissipate heat from the electrical component. The lower fin plates include sides extending from the lower ends to inner ends. Lower channels are defined between the sides of the lower fin plates. The lower spacer plates are received in corresponding channels between the sides of the lower fin plates. The lower plates extend between a front end and a rear end of the lower bridge element. The upper bridge element includes upper plates arranged in an upper plate stack. The upper plates include upper fin plates and upper spacer plates between the upper fin plates. The upper plates include upper ends that are configured to be mechanically and thermally coupled to a heat exchanger operably removing heat from the electrical component through the thermal bridge. The upper fin plates include sides extending from the upper ends to inner ends. Upper channels are defined between the sides of the upper fin plates. The upper spacer plates are received in corresponding channels between the sides of the upper fin plates. The upper plates extend between a front end and a rear end of the upper bridge element. The upper fin plates are received in corresponding lower channels and the lower fin plates are received in corresponding upper channels such that the upper fin plates are interleaved with the lower fin plates with the sides of the upper fin plates facing the sides of the lower fin plates for thermal exchange between the lower bridge element and the upper bridge element. The heat exchange assembly includes an installation spring element coupled between the lower plates and the upper plates. The installation spring element includes a lower spring arm biased against the lower plates during installation and the installation spring element including an upper spring arm biased against the upper plates during installation to bias the lower ends of the lower plates into the electrical component and to bias the upper ends of the upper plates into the heat exchanger. The installation spring element is removable from the thermal bridge after the lower plates are coupled to the electrical component and after the upper plates are coupled to the heat exchanger to remove the biasing force between the lower plates and the upper plates.

In another embodiment, a heat exchange assembly for a communication system having an electrical component is provided. The heat exchange assembly includes a heat exchanger including an inner surface and an outer surface. The heat exchanger dissipates heat from the electrical component. The heat exchange assembly includes a thermal bridge being positionable between the heat exchanger and the electrical component to transfer heat from the electrical component to the heat exchanger. The thermal bridge includes an upper bridge element and a lower bridge element separate and discrete from the upper bridge element. The upper bridge element is thermally coupled to the lower bridge element. The lower bridge element includes lower plates arranged in a lower plate stack. The lower plates include lower fin plates and lower spacer plates between the lower fin plates. The lower plates include lower ends configured to be secured to the electrical component by a lower adhesive layer to mechanically and thermally couple the lower plates to the electrical component to dissipate heat from the electrical component. The lower fin plates include sides extending from the lower ends to inner ends. Lower channels are defined between the sides of the lower fin plates. The lower spacer plates are received in corresponding channels between the sides of the lower fin plates. The lower plates extend between a front end and a rear end of the thermal bridge. The upper bridge element includes upper plates arranged in an upper plate stack. The upper plates include upper fin plates and upper spacer plates between the upper fin plates. The upper plates include upper ends secured to the lower surface of the heat exchanger by an upper adhesive layer to mechanically and thermally couple the upper plates to the heat exchanger. The upper fin plates include sides extending from the upper ends to inner ends. Upper channels are defined between the sides of the upper fin plates. The upper spacer plates are received in corresponding channels between the sides of the upper fin plates. The upper plates extend between the front end and the rear end of the thermal bridge. The upper fin plates are received in corresponding lower channels and the lower fin plates are received in corresponding upper channels such that the upper fin plates are interleaved with the lower fin plates with the sides of the upper fin plates facing the sides of the lower fin plates for thermal exchange between the lower bridge element and the upper bridge element. The heat exchange assembly includes a thermal bridge including a front spring pocket at the front end between the lower plates and the upper plates. The front spring pocket is configured to removably receive an installation spring element between the lower plates and the upper plates used to bias the lower plates against the electrical component and to bias the upper plates against the heat exchanger to set the lower adhesive layer and permanently secure the lower plates to the electrical component and to set the upper adhesive layer to permanently secure the upper plates to the heat exchanger. The installation spring element is removable from the front spring pocket after the lower and upper adhesive layers are set to remove biasing forces on the lower plates and the upper plates and allow the lower plates and the upper plates to be freely positionable relative to each other by the electrical component and the heat exchanger without the installation spring element.

In a further embodiment, a method of assembling a heat exchange assembly for dissipating heat from an electrical component is provided. The method positions a thermal bridge between the electrical component and a heat exchanger used for dissipating heat from the electrical component. The thermal bridge includes a lower bridge element and an upper bridge element. The lower bridge element includes lower plates arranged in a lower plate stack. The upper bridge element includes upper plates arranged in an upper plate stack. The lower plates and the upper plates are interleaved and in thermal communication with each other to transfer heat from the lower plates to the upper plates. The upper plates are movable relative to the lower plates. The method applies a lower thermal adhesive layer between an upper surface of the electrical component and lower ends of the lower plates. The method applies an upper thermal adhesive layer between a lower surface of the heat exchanger and upper ends of the upper plates. The method positions a removable installation spring element between the lower plates and the upper plates. The installation spring element biases the upper ends of the upper plates into the upper thermal adhesive layer and the lower surface of the heat exchanger. The installation spring element biases the lower ends of the lower plates into the lower thermal adhesive layer and the upper surface of the electrical component. The method cures the lower thermal adhesive layer to secure the lower ends of the lower plates to the electrical component. The method cures the upper thermal adhesive layer to secure the upper ends of the upper plates to the heat exchanger. The method removes the installation spring element from between the upper plates and the lower plates to allow positioning of the upper plates relative to the lower plates without a spring biasing force acting therebetween.

DETAILED DESCRIPTION OF THE INVENTION

Figure 1:
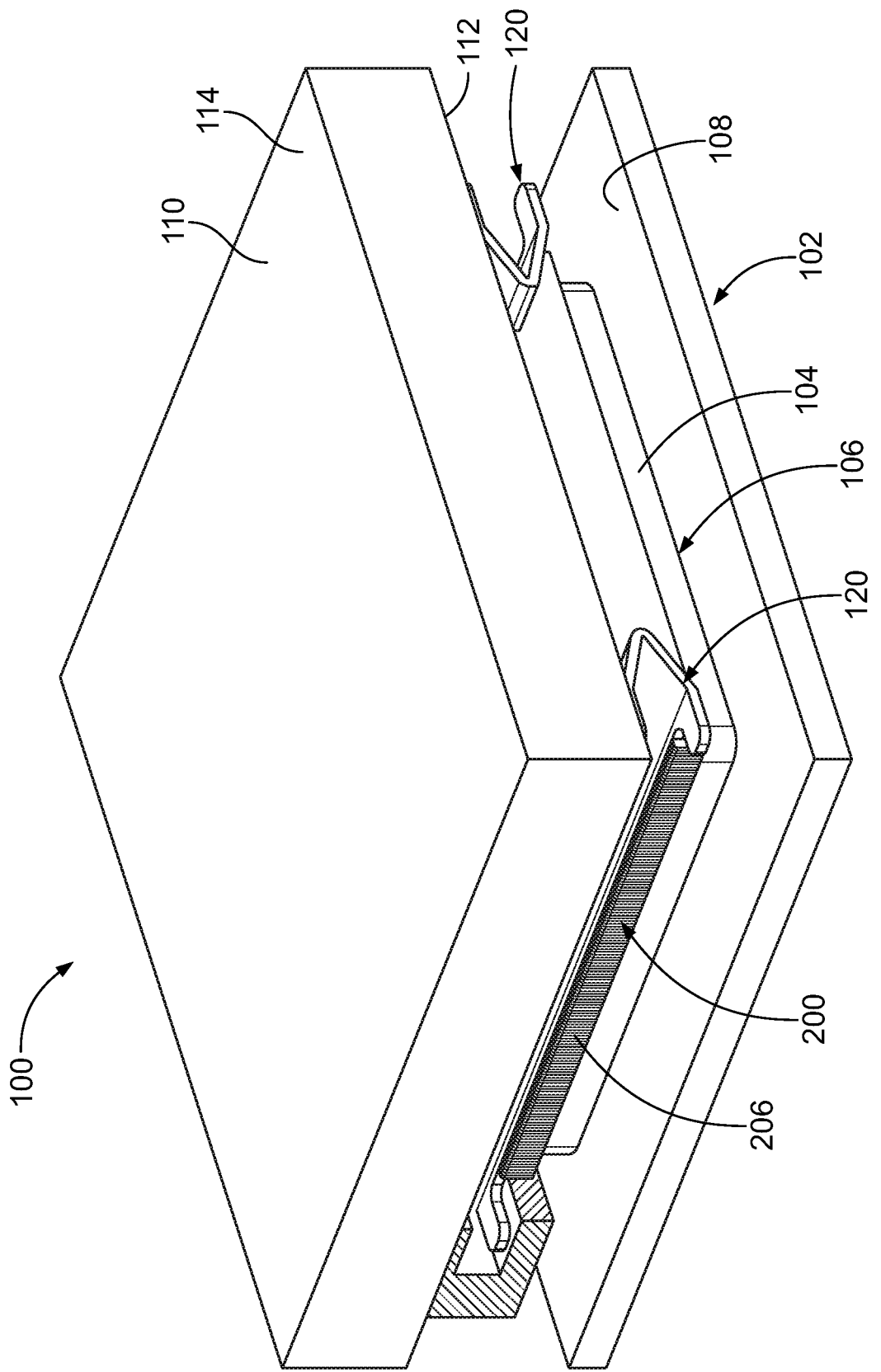
FIG. 1 is a front perspective view of a heat exchange assembly formed in accordance with an exemplary embodiment for a communication system.

FIG. 1 is a front perspective view of a heat exchange assembly 100 formed in accordance with an exemplary embodiment for a communication system 102. The communication system 102 includes an electrical component 104 mounted to a mounting area 106 (for example, an upper surface) of a host circuit board 108. The electrical component 104 is a heat generating component. For example, the electrical component 104 generates heat when transmitting data. In an exemplary embodiment, the electrical component 104 is a processor, a memory module, an electronic package, a chip, such as an ASIC, and the like.

The heat exchange assembly 100 includes a heat exchanger 110 and a thermal bridge 200 used to thermally couple the heat exchanger 110 with the electrical component 104. The heat exchanger 110 is used to dissipate heat from the electrical component. The heat exchanger 110 may be a heat sink, a heat spreader, a cold plate, and the like. The heat exchanger 110 may dissipate the heat into the exterior environment, such as through airflow over the heat exchanger 110. In other various embodiments, the heat exchanger 110 may dissipate heat into a cooling fluid, such as water or refrigerant passing through the heat exchanger 110. For example, the heat exchanger may include channels and/or pipes. The heat exchanger 110 may be a solid block in various embodiments.

The heat exchanger 110 includes a lower surface 112 and an upper surface 114. The heat exchanger 110 may include fins (not shown), such as vertical plates or posts, extending along the upper surface 114. The fins allow airflow through the heat exchanger 110. The fins add surface area for the heat exchanger 110 to enhance heat dissipation into the external environment. The thermal bridge 200 is thermally coupled to the heat exchanger 110 at the lower surface 112. In an exemplary embodiment, the thermal bridge 200 is mechanically secured to the heat exchanger 110 at the lower surface 112. For example, the thermal bridge 200 may be adhered to the heat exchanger 110 using a thermally conductive adhesive. The adhesive creates a thermal interface between the thermal bridge 200 and the heat exchanger 110. The thermal bridge 200 may be coupled to the heat exchanger 110 by other means in alternative embodiments, such as using a thermal grease, welding, and the like. In various embodiments, the thermal bridge 200 is coupled to the heat exchanger 110 using another structure, such as a support frame.

The thermal bridge 200 is thermally coupled to the electrical component 104. In an exemplary embodiment, the thermal bridge 200 is mechanically secured to the electrical component 104. For example, the thermal bridge 200 may be adhered to the electrical component 104 using a thermally conductive adhesive. The adhesive creates a thermal interface between the thermal bridge 200 and the electrical component 104. The thermal bridge 200 may be coupled to the electrical component 104 by other means in alternative embodiments, such as using a thermal grease, welding, and the like. In various embodiments, the thermal bridge 200 is coupled to the electrical component 104 using another structure, such as a support frame.

In an exemplary embodiment, the heat exchange assembly 100 includes removable installation spring elements 120 used during installation and assembly of the heat exchange assembly 100 with the electrical component 104. The installation spring elements 120 are configured to be removed from the thermal bridge 200 after the thermal bridge 200 is coupled to the electrical component 104 and to the heat exchanger 110. For example, the installation spring elements 120 are used to hold the thermal bridge 200 while the adhesive between the thermal bridge 200 and the electrical component 104 sets and/or while the adhesive between the thermal bridge 200 and the heat exchanger 110 sets. After the adhesive sets, the thermal bridge 200 is fixed between the electrical component 104 and the heat exchanger 110 and the installation spring elements 120 can be removed. The installation spring elements 120 are removed and not used in normal operation of the communication system 102. As such, the installation spring elements 120 do not impart a spring biasing force against the thermal bridge 200 during normal operation of the communication system 102. The installation spring elements 120 do not affect the electrical component 104 or the heat exchanger 110 during thermal expansion and thermal contraction of the electrical component 104 and/or the heat exchanger 110.

Figure 2:
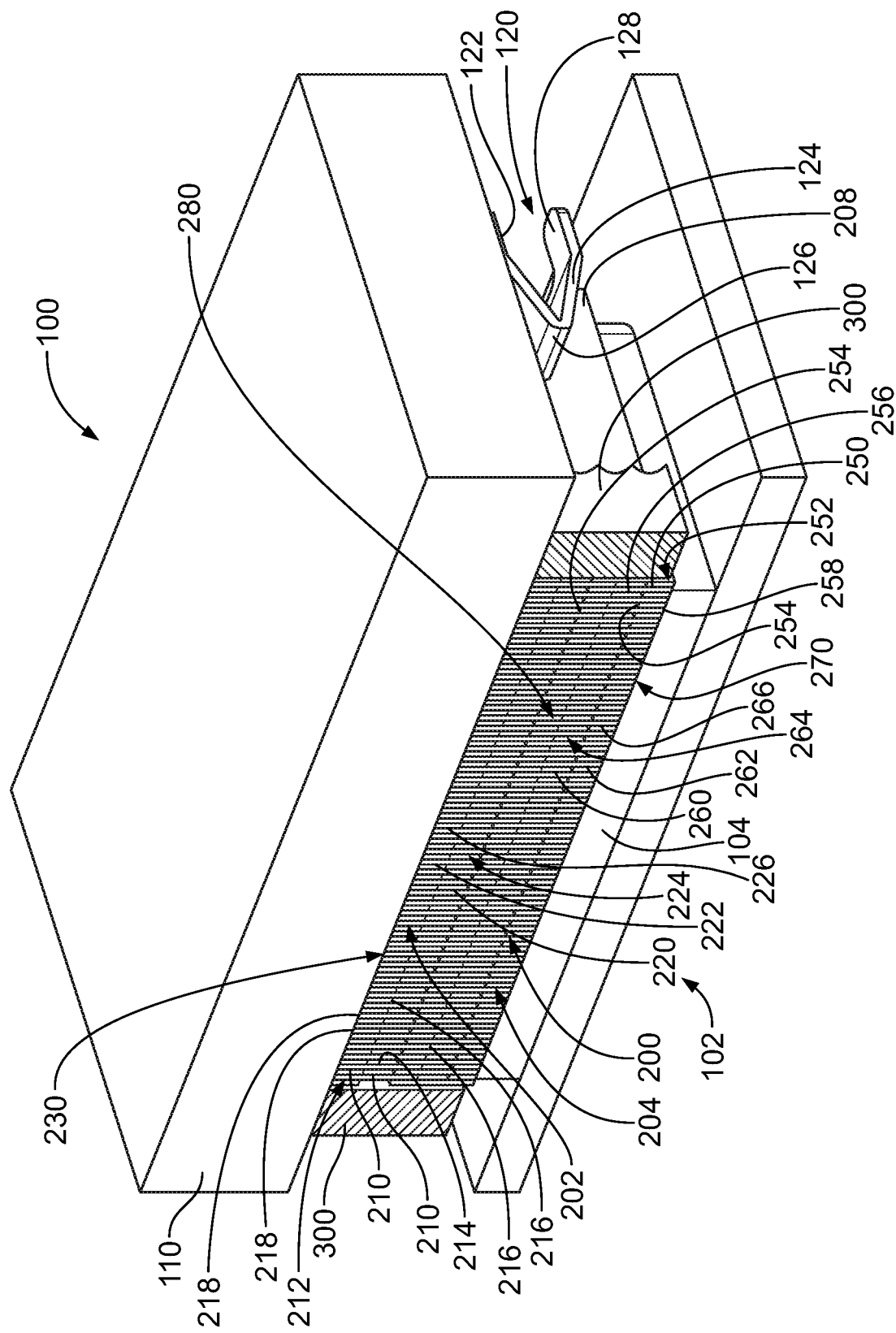
FIG. 2 is a perspective cross-sectional, view of the heat exchange assembly in accordance with an exemplary embodiment.

FIG. 2 is a perspective cross-sectional, view of the heat exchange assembly 100 and the communication system 102 in accordance with an exemplary embodiment. In an exemplary embodiment, the thermal bridge 200 includes an upper bridge element 202, a lower bridge element 204, and the removable installation spring element 120 between the upper and lower bridge elements 202, 204. The lower bridge element 204 is configured to thermally engage the electrical component 104. The upper bridge element 202 is configured to engage the heat exchanger 110. The upper bridge element 202 is in thermal communication with the lower bridge element 204 and dissipates heat away from the lower bridge element 204 to cool the electrical component 104. Optionally, the upper and lower bridge elements 202, 204 may be positioned relative to each other to allow airflow through the thermal bridge 200. In an exemplary embodiment, the upper and lower bridge elements 202, 204 are movable relative to each other, such as to allow thermal expansion and thermal contraction of the electrical component 104 and/or the heat exchanger 110.

In an exemplary embodiment, the heat exchange assembly 100 includes a frame 300 (a portion is illustrated in FIG. 2) coupled to the thermal bridge 200. The frame 300 may be coupled to the upper bridge element 202 and/or the lower bridge element 204. The frame 300 is used to hold the upper bridge element 202 relative to the lower bridge element 204. Optionally, the frame 300 holds side-to-side movement of the upper bridge element 202 and/or the lower bridge element 204. The frame 300 may be used to prevent front-to-rear movement of the upper bridge element 202 and/or the lower bridge element 204. In an exemplary embodiment, the upper bridge element 202 and/or the lower bridge element 204 may be movable vertically within the frame 300, such as to allow thermal expansion and thermal contraction of the electrical component 104 and/or the heat exchanger 110. The frame 300 may receive the installation spring elements 120, such as through openings in the frame 300. Optionally, the installation spring elements 120 may be removable from the frame 300, such as through the openings.

During assembly, the installation spring elements 120 are located between the upper and lower bridge elements 202, 204. In an exemplary embodiment, the installation spring elements 120 are located at a front end 206 (shown in FIG. 1) of the thermal bridge 200 and at a rear end 208 of the thermal bridge 200. Other locations are possible in alternative embodiments. The installation spring elements 120 force the upper and lower bridge elements 202, 204 apart from each other. The installation spring elements 120 force the upper bridge element 202 in a first biasing direction, such as upward, toward the heat exchanger 110. For example, the installation spring elements 120 force the upper bridge element 202 into the heat exchanger 110 during the time that the adhesive is curing or setting to ensure adequate mechanical and thermal coupling between the upper bridge element 202 and the heat exchanger 110. The installation spring elements 120 force the lower bridge element 204 in a second biasing direction, such as downward, toward the electrical component 104. For example, the installation spring elements 120 force the lower bridge element 204 into the electrical component 104 during the time that the adhesive is curing or setting to ensure adequate mechanical and thermal coupling between the lower bridge element 204 and the electrical component 104.

In an exemplary embodiment, each installation spring element 120 is a stamped and formed part. The installation spring element 120 may be manufactured from a thin metal material such that the installation spring element 120 is flexible. The installation spring element 120 includes an upper spring arm 122, a lower spring arm 124 and a folded portion 126 between the upper and lower spring arms 122, 124. The folded portion 126 may be U-shaped or V-shaped in various embodiments. The folded portion 126 is flexible and configured to spread the upper and lower spring arms 122, 124 apart when the folded portion is flexed or compressed. In an exemplary embodiment, the installation spring element 120 includes removal tabs 128 used for removing the installation spring element 120 from the thermal bridge 200. The removal tabs 128 are actuated to compress the installation spring element 120. The removal tabs 128 may be exposed beyond the sides and/or the ends of the thermal bridge 200 for actuation.

When installed, the upper spring arm 122 is biased upward against the upper bridge element 202 and the lower spring arm 122 is biased downward against the lower bridge element 204. The installation spring element 120 is compressible and expandable. For example, the upper and lower spring arms 122, 124 may be compressed relatively toward each other and may be expanded relatively away from each other. In various embodiments, the upper spring arm 122 and/or the lower spring arm 124 and/or the folded portion 126 may be segmented to allow relative independent movement of the segments.

In an exemplary embodiment, the bridge elements 202, 204 each include a plurality of plates that are arranged together in plate stacks. The plates are interleaved with each other for thermal communication between the upper bridge element 202 and the lower bridge element 204. The individual plates are movable relative to each other such that the plates may be individually articulated to conform to the upper surface of the electrical component 104 and the lower surface of the heat exchanger 110 for improved contact and/or proximity between the thermal bridge 200 and the electrical component 104 and the heat exchanger 110.

In an exemplary embodiment, the upper bridge element 202 includes a plurality of upper plates 210 arranged in an upper plate stack 212. Each upper plate 210 has sides 214 extending between a lower end or an inner end 216 and an outer end or upper end 218 of the upper plate 210. The inner end 216 faces the lower bridge element 204. The upper end 218 faces the heat exchanger 110. Optionally, various upper plates 210 may have different heights between the inner ends 216 and the outer ends 218. For example, some of the upper plates 210 may be taller to form upper fin plates 220 for the thermal bridge 200 and some of the upper plates 210 may be shorter to form upper spacer plates 222. The upper spacer plates 222 are located between the upper fin plates 220. The upper fin plates 220 form upper channels 224 therebetween. The upper spacer plates 222 are received in corresponding upper channels 224.

In an exemplary embodiment, each upper fin plate 220 includes a base 226 at the outer end 218. The base 226 is aligned with the upper spacer plates 222. The sides 214 of the upper fin plates 220 at the bases 226 face the sides 214 of the upper spacer plates 222. The upper spacer plates 222 are thermally coupled to the bases 226 of the upper fin plates 220 to transfer heat across the entire upper end of the upper bridge element 202 for efficient heat transfer to the heat exchanger 110.

In an exemplary embodiment, the lower bridge element 204 includes a plurality of lower plates 250 arranged in a lower plate stack 252. Each lower plate 250 has sides 254 extending between an upper end or an inner end 256 and a lower end or an outer end 258 of the lower plate 250. The inner end 256 faces the upper bridge element 202. The lower end 258 faces the electrical component 104. Optionally, various lower plates 250 may have different heights between the inner ends 256 and the outer ends 258. For example, some of the lower plates 250 may be taller to form lower fin plates 260 for the thermal bridge 200 and some of the lower plates 250 may be shorter to form lower spacer plates 262. The lower spacer plates 262 are located between the lower fin plates 260. The lower fin plates 260 form lower channels 264 therebetween. The lower spacer plates 262 are received in corresponding lower channels 264.

In an exemplary embodiment, each lower fin plate 260 includes a base 266 at the lower end 258. The base 266 is aligned with the lower spacer plates 262. The sides 254 of the lower fin plates 260 at the bases 266 face the sides 254 of the lower spacer plates 262. The lower spacer plates 262 are thermally coupled to the bases 266 of the lower fin plates 260 to transfer heat across the entire lower end of the lower bridge element 204 for efficient heat transfer to the electrical component 104.

When assembled, the upper plates 210 are interleaved with the lower plates 250. The upper and lower plates 210, 250 are held in the frame 300, such as stacked or sandwiched together between opposite sides and ends of the frame 300. The upper and lower plates 210, 250 are held in vertical orientations in the frame. The upper fin plates 220 are received in the lower channels 264 and the lower fin plates 260 are received in the upper channels 224. For example, the upper fin plates 220 may be aligned with the lower spacer plates 262 across the lower channels 264 and the lower fin plates 260 may be aligned with the upper spacer plates 222 across the upper channels 224.

In an exemplary embodiment, the upper fin plates 220 interface with the lower fin plates 260 at a thermal bridge interface 280. The upper bridge element 202 is thermally coupled to the lower bridge element 204 at the thermal bridge interface 280. The sides 214 face the sides 254 at the thermal bridge interface 280. The sides 214, 254 are overlapping by an overlap distance sufficient to allow efficient thermal transfer between the lower plates 250 and the upper plates 210. The sides 214, 254 are slidable relative to each other to allow movement between the upper plates 210 and the lower plates 250 and change the overlap distance. In an exemplary embodiment, the upper fin plates 220 are movable relative to the lower fin plates 260 at the thermal bridge interface 280, such as during thermal expansion and thermal contraction of the electrical component 104 and/or the heat exchanger 110. The upper channels 224 and the lower channels 264 accommodate relative movement of the upper fin plates 220 and the lower fin plates 260, such as during thermal expansion and thermal contraction of the electrical component 104 and/or the heat exchanger 110.

When assembled, the upper plates 210 are securely fixed to the heat exchanger 110 and the lower plates 250 are securely fixed to the electrical component 104. For example, an upper adhesive layer 230 is provided between the upper plates 210 and the heat exchanger 110 and a lower adhesive layer 270 is provided between the lower plates 250 and the electrical component 104. The upper adhesive layer 230 fixes the upper plates 210 to the heat exchanger 110 to move the upper plates 210 with the heat exchanger 110, such as during thermal expansion and thermal contraction of the heat exchanger 110. The lower adhesive layer 270 fixes the lower plates 250 to the electrical component 104 to move the lower plates 250 with the electrical component 104, such as during thermal expansion and thermal contraction of the electrical component 104. The inner ends 216, 256 of the upper and lower plates 210, 250 are slidable relative to each other at the thermal bridge interface 280.

Figure 3:
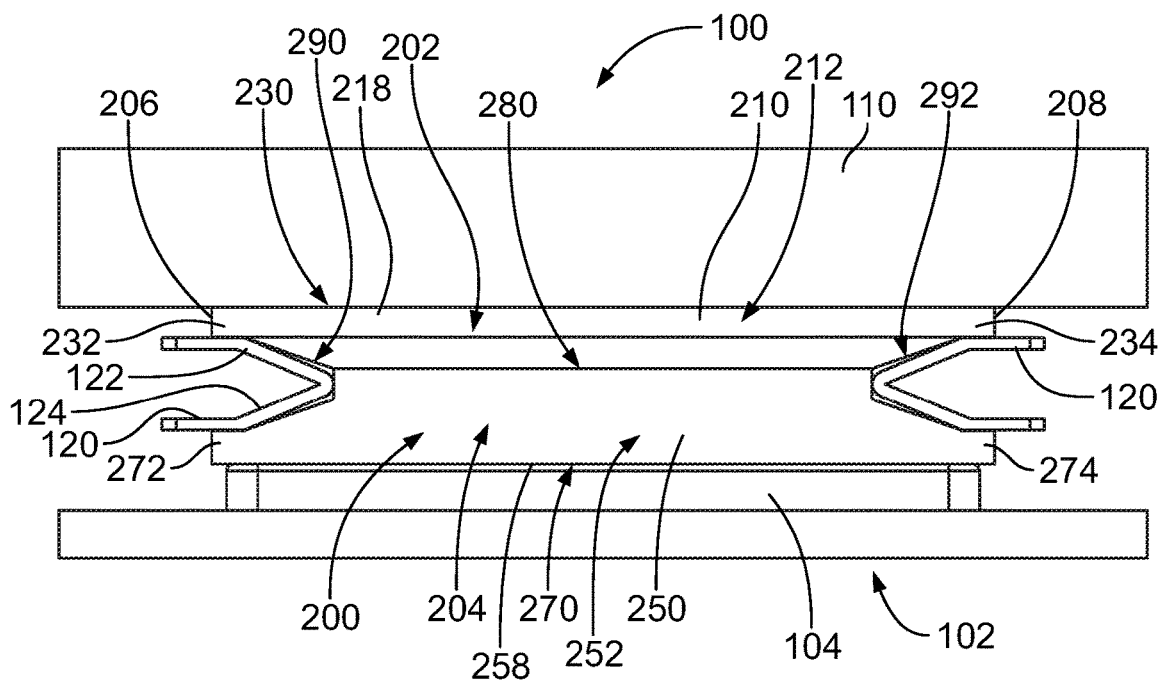
FIG. 3 is a side, elevational view of the heat exchange assembly in accordance with an exemplary embodiment showing removable installation spring elements installed in a thermal bridge.
Figure 4:
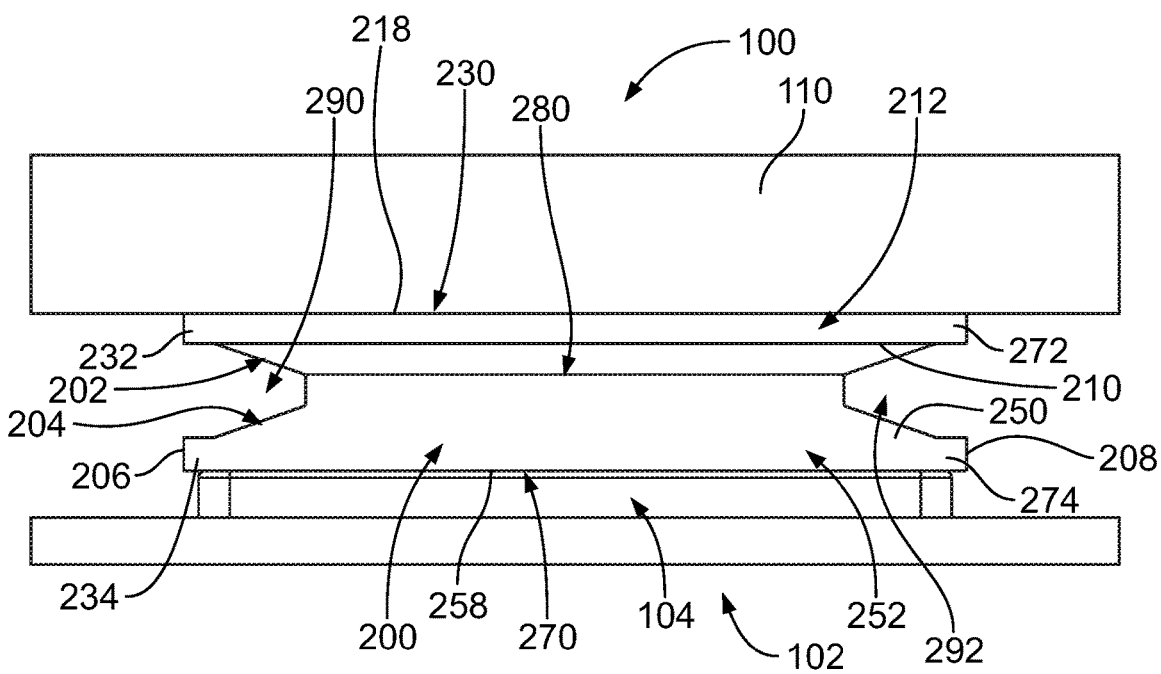
FIG. 4 is a side, elevational view of the heat exchange assembly in accordance with an exemplary embodiment with the installation spring elements removed from the thermal bridge.

FIG. 3 is a side, elevational view of the heat exchange assembly 100 and the communication system 102 in accordance with an exemplary embodiment showing the removable installation spring elements 120 installed in the thermal bridge 200. FIG. 4 is a side, elevational view of the heat exchange assembly 100 and the communication system 102 in accordance with an exemplary embodiment showing the installation spring elements 120 removed from the thermal bridge 200. The thermal bridge 200 thermally couples the heat exchanger 110 with the electrical component 104 to dissipate heat from the electrical component 104. The upper bridge element 202 is thermally coupled to the lower bridge element 204 at the thermal bridge interface 280. The installation spring element 120 is positionable between the upper and lower bridge elements 202, 204 during installation and assembly of the heat exchange assembly 100 and is removable from the thermal bridge 200 after the upper and lower bridge elements 202, 204 are coupled to the heat exchanger 110 and the electrical component 104, respectively.

In an exemplary embodiment, the thermal bridge 200 includes a front spring pocket 290 at the front end 206 and a rear spring pocket 292 at the rear end 208. The front and rear spring pockets 290, 292 removably receive the installation spring elements 120. The spring pockets 290, 292 are sized and shaped to receive the installation spring elements 120 such that the upper spring arms 122 are positionable below the upper bridge element 202 and the lower spring arms 124 are positionable above the lower bridge element 204. In an exemplary embodiment, the upper plates 210 include upper lips 232 at the front end 206 and upper lips 234 at the rear end 208. The lower plates 250 include lower lips 272 at the front end 206 and lower lips 274 at the rear end 208. The front spring pocket 290 is defined between the upper lips 232 and the lower lips 272. The rear spring pocket 292 is defined between the upper lips 234 and the lower lips 274. Optionally, the lips 232, 234, 272, 274 may be angled to accommodate the shape of the installation spring elements 120. For example, the lips 232, 234 may have a complementary shape as the upper spring arms 122 to accommodate the upper spring arms 122 of the installation spring elements 120 and the lips 272, 274 may have a complementary shape as the lower spring arms 124 to accommodate the lower spring arms 124 of the installation spring elements 120. The upper spring arms 122 press upward against the upper plates 210, such as against the upper lips 232, 234. The lower spring arms 124 press downward against the lower plates 250, such as against the lower lips 272, 274.

During assembly, the installation spring elements 120 are positioned in the spring pockets 290, 292 between the lower plates 250 and the upper plates 210 of the thermal bridge 200. In an exemplary embodiment, the lower ends 258 of the lower plates 250 are adhered to the electrical component 104 using adhesive at the lower adhesive layer 270 to secure the lower plates 250 to the electrical component 104. The installation spring elements 120 bias the lower plates 250 against the electrical component 104 as the adhesive of the lower adhesive layer 270 sets and permanently secures the lower plates 250 to the electrical component 104. In an exemplary embodiment, the upper ends 218 of the upper plates 210 are adhered to the heat exchanger 110 using adhesive at the upper adhesive layer 230 to secure the upper plates 210 to the heat exchanger 110. The installation spring elements 120 bias the upper plates 210 against the heat exchanger 110 as the adhesive of the upper adhesive layer 230 sets to permanently secure the upper plates 210 to the heat exchanger 110. Once the thermal bridge 200 is installed, the upper bridge element 202 is supported by (for example, hanging from) the heat exchanger 110 and the lower bridge element 204 is supported by (for example, rests upon) the electrical component 104. There is no longer a need for the installation spring elements 120 to support the upper bridge element 202 relative to the lower bridge element 204. The heat exchanger 110 may be separately supported or positioned relative to the electrical component 104, such as using mounting hardware. The upper bridge element 202 is thus separately supported compared to the lower bridge element 204, using the heat exchanger 110 and the electrical component 104, respectively. For example, when the electrical component 104 is fixed in position, the lower bridge element 204 is fixed in position with the electrical component 104 and when the heat exchanger 110 is fixed in position, the upper bridge element 202 is fixed in position with the heat exchanger 110.

The installation spring elements 120 are removed after installation of the thermal bridge 200 between the electrical component 104 and the heat exchanger 110. The upper plates 210 of the upper plate stack 212 are freely movable relative to the lower plates 250 of the lower plate stack 252 after the installation spring elements 120 are removed without spring biasing forces acting on the upper plates 210 or the lower plates 250. The installation spring elements 120 are removable from the spring pockets 290, 292 after the adhesive layers 230, 270 are set. In an exemplary embodiment, the installation spring elements 120 are removed to remove the biasing forces on the lower plates 250 and the upper plates 210. The installation spring elements 120 are removed to allow the lower plates 250 and the upper plates 210 to be freely positionable relative to each other by the relative positions of the electrical component 104 and the heat exchanger 110 without the installation spring elements 120 pressing outward against the upper and lower bridge elements 202, 204. When the installation spring elements 120 are removed, the preload or positive pressure acting on the upper and lower bridge elements 202, 204 is eliminated, thus allowing free thermal expansion and thermal contraction of the electrical component 104 and the heat exchanger 110.

Figure 5:
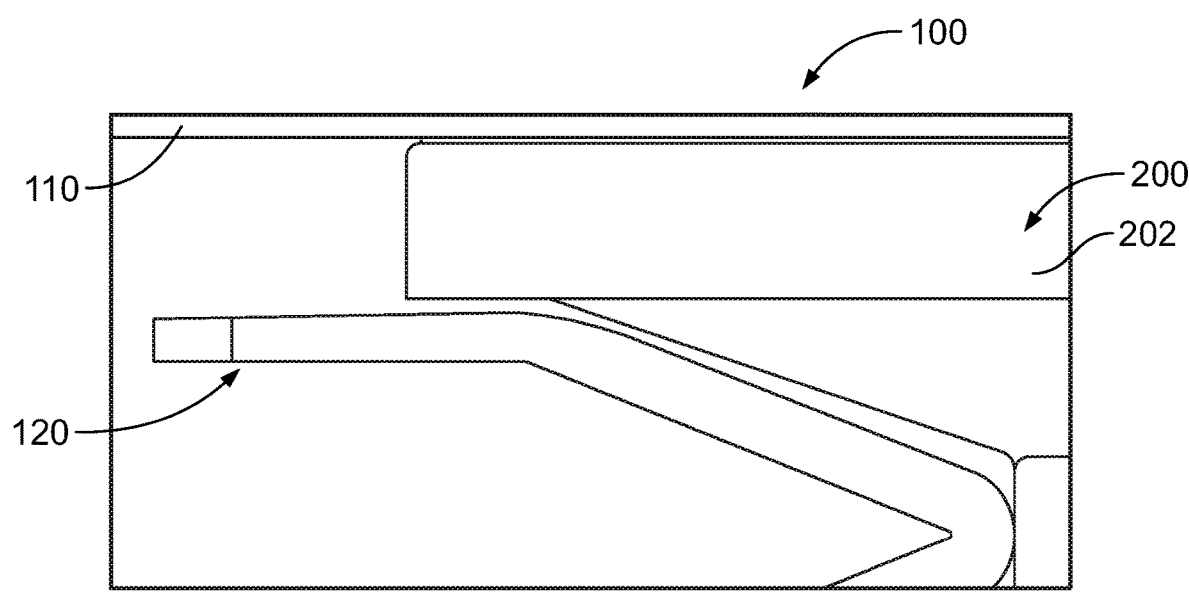
FIG. 5 is a partial side, elevational view of a portion of the heat exchange assembly and the communication system in accordance with an exemplary embodiment.

FIG. 5 is a partial side, elevational view of a portion of the heat exchange assembly 100 and the communication system 102 in accordance with an exemplary embodiment. FIG. 5 illustrates the removable installation spring element 120 installed in the thermal bridge 200 in a released state. In the released state, the installation spring element 120 is removed from a biasing position. The installation spring element 120 is not biased against the thermal bridge 200. The installation spring element 120 does not press the upper bridge element 202 outward.

The installation spring element 120 is moved to the released state after the thermal bridge 200 is coupled to the electrical component 104 and the heat exchanger 110. For example, the installation spring element 120 is moved to the released state after the upper bridge element 202 is adhered to the heat exchanger 110. As such, the upper bridge element 202 is supported by the heat exchanger 110 and no longer requires the installation spring element 120 to support the upper bridge element 202. In various embodiments, the installation spring element 120 is moved to the released state by plastically deforming the installation spring element 120. Optionally, the installation spring element 120 may be manufactured from a material that plastically deforms at temperature. For example, the installation spring element 120 may be stiff and compressible at the installation temperature but may soften and plastically deform at the adhesive curing temperature or the operating temperature of the heat exchange assembly 100 such that the installation spring element 120 does not impart spring force when operated. The installation spring element 120 is inactive after installation of the thermal bridge 200 during operation of the communication system 102.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A heat exchange assembly for a communication system having an electrical component, the heat exchange assembly comprising:
   a thermal bridge including an upper bridge element and a lower bridge element separate and discrete from the upper bridge element, the upper bridge element being thermally coupled to the lower bridge element;
   the lower bridge element including lower plates arranged in a lower plate stack, the lower plates including lower fin plates and lower spacer plates between the lower fin plates, the lower plates including lower ends configured to be mechanically and thermally coupled to the electrical component to dissipate heat from the electrical component, the lower fin plates including sides extending from the lower ends to inner ends, lower channels being defined between the sides of the lower fin plates, the lower spacer plates being received in corresponding channels between the sides of the lower fin plates, the lower plates extending between a front end and a rear end of the lower bridge element;
   the upper bridge element including upper plates arranged in a upper plate stack, the upper plates including upper fin plates and upper spacer plates between the upper fin plates, the upper plates including upper ends configured to be mechanically and thermally coupled to a heat exchanger operably removing heat from the electrical component through the thermal bridge, the upper fin plates including sides extending from the upper ends to inner ends, upper channels being defined between the sides of the upper fin plates, the upper spacer plates being received in corresponding channels between the sides of the upper fin plates, the upper plates extending between a front end and a rear end of the upper bridge element;
   wherein the upper fin plates are received in corresponding lower channels and the lower fin plates are received in corresponding upper channels such that the upper fin plates are interleaved with the lower fin plates with the sides of the upper fin plates facing the sides of the lower fin plates for thermal exchange between the lower bridge element and the upper bridge element; and
   an installation spring element coupled between the lower plates and the upper plates, the installation spring element including a lower spring arm being biased against the lower plates during installation and the installation spring element including an upper spring arm being biased against the upper plates during installation to bias the lower ends of the lower plates into the electrical component and to bias the upper ends of the upper plates into the heat exchanger;
   wherein the installation spring element is removable from the thermal bridge after the lower plates are coupled to the electrical component and after the upper plates are coupled to the heat exchanger to remove the biasing force between the lower plates and the upper plates.

2. The heat exchange assembly of claim 1, wherein the installation spring element is positioned between the lower plates and the upper plates during installation of the thermal bridge between the electrical component and the heat exchanger and is removed after installation of the thermal bridge between the electrical component and the heat exchanger.

3. The heat exchange assembly of claim 1, wherein the upper plate stack is freely movable relative to the lower plate stack after the installation spring element is removed without spring biasing forces acting on the upper plates or the lower plates.

4. The heat exchange assembly of claim 1, wherein the lower ends of the lower plates are configured to be adhered to the electrical component using adhesive to secure the lower plates to the electrical component and the upper ends of the upper plates are configured to be adhered to the heat exchanger using adhesive to secure the upper plates to the heat exchanger, the installation spring element biasing the lower plates against the electrical component as the adhesive sets and the installation spring element biasing the upper plates against the heat exchanger as the adhesive sets, the installation spring element being removed from the thermal bridge after the adhesive sets.

5. The heat exchange assembly of claim 1, further comprising a lower adhesive layer between the lower plates and the electrical component and an upper adhesive layer between the upper plates and the heat exchanger, the installation spring element being removed from the thermal bridge after the lower adhesive layer secures the lower plates to the electrical component and after the upper adhesive layer secures the upper plates to the heat exchanger.

6. The heat exchange assembly of claim 1, wherein the installation spring element includes a removal tab extending therefrom, the removal tab being operable to remove the installation spring element from between the upper bridge element and the lower bridge element.

7. The heat exchange assembly of claim 1, wherein the installation spring element is removable from the thermal bridge by removing the spring forces acting on the lower plates and the upper plates without physically removing the installation spring element from between the lower bridge element and the upper bridge element.

8. The heat exchange assembly of claim 1, wherein the lower plates include lower lips at the front end of the thermal bridge and the upper plates include upper lips at the front end of the thermal bridge, the thermal bridge including a front spring pocket between the lower lips and the upper lips, the front spring pocket receiving the installation spring element, the installation spring element being removable from the front spring pocket.

9. The heat exchange assembly of claim 1, wherein the upper plates are movable relative to the lower plates.

10. The heat exchange assembly of claim 1, wherein the installation spring element is a front installation spring element engaging the lower plates and the upper plates at the front end of the thermal bridge, the heat exchange assembly further comprising a rear installation spring element engaging the lower plates and the upper plates at the rear end of the thermal bridge, the rear installation spring element being removable from the thermal bridge after the lower plates are coupled to the electrical component and after the upper plates are coupled to the heat exchanger to remove the biasing force between the lower plates and the upper plates.

11. The heat exchange assembly of claim 1, further comprising a frame holding side-to-side positions of the lower plates relative to each other in the lower plate stack and holding side-to-side positions of the upper plates relative to each other in the upper plate stack, the upper plates being vertically movable relative to the lower plates within the frame.

12. A heat exchange assembly for a communication system having an electrical component, the heat exchange assembly comprising:
   a heat exchanger including an inner surface and an outer surface, the heat exchanger for dissipating heat from the electrical component; and
   a thermal bridge being positionable between the heat exchanger and the electrical component to transfer heat from the electrical component to the heat exchanger, the thermal bridge including an upper bridge element and a lower bridge element separate and discrete from the upper bridge element, the upper bridge element being thermally coupled to the lower bridge element;
   the lower bridge element including lower plates arranged in a lower plate stack, the lower plates including lower fin plates and lower spacer plates between the lower fin plates, the lower plates including lower ends configured to be secured to the electrical component by a lower adhesive layer to mechanically and thermally couple the lower plates to the electrical component to dissipate heat from the electrical component, the lower fin plates including sides extending from the lower ends to inner ends, lower channels being defined between the sides of the lower fin plates, the lower spacer plates being received in corresponding channels between the sides of the lower fin plates, the lower plates extending between a front end and a rear end of the thermal bridge;
   the upper bridge element including upper plates arranged in a upper plate stack, the upper plates including upper fin plates and upper spacer plates between the upper fin plates, the upper plates including upper ends secured to the lower surface of the heat exchanger by an upper adhesive layer to mechanically and thermally couple the upper plates to the heat exchanger, the upper fin plates including sides extending from the upper ends to inner ends, upper channels being defined between the sides of the upper fin plates, the upper spacer plates being received in corresponding channels between the sides of the upper fin plates, the upper plates extending between the front end and the rear end of the thermal bridge;
   wherein the upper fin plates are received in corresponding lower channels and the lower fin plates are received in corresponding upper channels such that the upper fin plates are interleaved with the lower fin plates with the sides of the upper fin plates facing the sides of the lower fin plates for thermal exchange between the lower bridge element and the upper bridge element; and
   wherein the thermal bridge includes a front spring pocket at the front end between the lower plates and the upper plates, the front spring pocket configured to removably receive an installation spring element between the lower plates and the upper plates used to bias the lower plates against the electrical component and to bias the upper plates against the heat exchanger to set the lower adhesive layer and permanently secure the lower plates to the electrical component and to set the upper adhesive layer to permanently secure the upper plates to the heat exchanger, the installation spring element being removable from the front spring pocket after the lower and upper adhesive layers are set to remove biasing forces on the lower plates and the upper plates and allow the lower plates and the upper plates to be freely positionable relative to each other by the electrical component and the heat exchanger without the installation spring element.

13. The heat exchange assembly of claim 12, wherein the lower plates are positioned below the front spring pocket and the upper plates are positioned above the front spring pocket, the front spring pocket being open at the front end to allow insertion and removal of the installation spring element through the open front end.

14. The heat exchange assembly of claim 12, wherein the front spring pocket is configured to receive the installation spring element between the lower plates and the upper plates during installation of the thermal bridge between the electrical component and the heat exchanger and the front spring pocket is configured to allow removal of the installation spring element after installation of the thermal bridge between the electrical component and the heat exchanger.

15. The heat exchange assembly of claim 12, wherein the lower plates include lower lips at the front end of the thermal bridge and the upper plates include upper lips at the front end of the thermal bridge, the front spring pocket defined between the lower lips and the upper lips.

16. The heat exchange assembly of claim 12, wherein the thermal bridge includes a rear spring pocket at the rear end between the lower plates and the upper plates, the rear spring pocket configured to removably receive a rear installation spring element between the lower plates and the upper plates used to bias the lower plates against the electrical component and to bias the upper plates against the heat exchanger to set the lower adhesive layer and permanently secure the lower plates to the electrical component and to set the upper adhesive layer to permanently secure the upper plates to the heat exchanger, the rear installation spring element being removable from the rear spring pocket after the lower and upper adhesive layers are set to remove biasing forces on the lower plates and the upper plates and allow the lower plates and the upper plates to be freely positionable relative to each other by the electrical component and the heat exchanger without the rear installation spring element.

17. The heat exchange assembly of claim 12, further comprising a frame holding side-to-side positions of the lower plates relative to each other in the lower plate stack and holding side-to-side positions of the upper plates relative to each other in the upper plate stack, the upper plates being vertically movable relative to the lower plates within the frame.

18. A method of assembling a heat exchange assembly for dissipating heat from an electrical component, the method comprising:
   positioning a thermal bridge between the electrical component and a heat exchanger used for dissipating heat from the electrical component, the thermal bridge including a lower bridge element and an upper bridge element, the lower bridge element including lower plates arranged in a lower plate stack, the upper bridge element including upper plates arranged in an upper plate stack, the lower plates and the upper plates being interleaved and in thermal communication with each other to transfer heat from the lower plates to the upper plates, the upper plates being movable relative to the lower plates;

applying a lower thermal adhesive layer between an upper surface of the electrical component and lower ends of the lower plates;

applying an upper thermal adhesive layer between a lower surface of the heat exchanger and upper ends of the upper plates;

positioning a removable installation spring element between the lower plates and the upper plates, the installation spring element biasing the upper ends of the upper plates into the upper thermal adhesive layer and the lower surface of the heat exchanger, the installation spring element biasing the lower ends of the lower plates into the lower thermal adhesive layer and the upper surface of the electrical component;

curing the lower thermal adhesive layer to secure the lower ends of the lower plates to the electrical component;

curing the upper thermal adhesive layer to secure the upper ends of the upper plates to the heat exchanger; and removing the installation spring element from between the upper plates and the lower plates to allow positioning of the upper plates relative to the lower plates without a spring biasing force acting therebetween.

19. The method of claim 18, further comprising compressing the removable installation spring during curing of the lower thermal adhesive layer and the upper thermal adhesive layer.

20. The method of claim 18, further comprising fixing the electrical component to a host circuit board and fixing the heat exchanger to a support structure to rigidly fix the heat exchanger relative to the electrical component prior to removing the installation spring element from between the upper plates and the lower plates.

* * * * *